United States Patent
Ji et al.

(10) Patent No.: US 7,517,552 B2
(45) Date of Patent: Apr. 14, 2009

(54) GLASS BEADS COATING PROCESS

(75) Inventors: Jingjia Ji, Croydon (AU); Paul A. Basore, Caringbah (AU); Rhett Evans, Bulli (AU)

(73) Assignee: Pacific Solar Pty Limited (AU)

( * ) Notice: Subject to any disclaimer, the term of this patent is extended or adjusted under 35 U.S.C. 154(b) by 904 days.

(21) Appl. No.: 10/487,580

(22) PCT Filed: Aug. 20, 2002

(86) PCT No.: PCT/AU02/01124

§ 371 (c)(1), (2), (4) Date: Jul. 7, 2004

(87) PCT Pub. No.: WO03/019676

PCT Pub. Date: Mar. 6, 2003

(65) Prior Publication Data

US 2004/0245212 A1 Dec. 9, 2004

(30) Foreign Application Priority Data

Aug. 23, 2001 (AU) ................................... PR7198

(51) Int. Cl.
*B05D 5/12* (2006.01)

(52) U.S. Cl. ............... 427/74; 427/397.7; 427/443.2; 136/256

(58) Field of Classification Search ............... 427/74, 427/430.1–443.2, 77; 118/428, 503; 438/71; 136/243–265
See application file for complete search history.

(56) References Cited

U.S. PATENT DOCUMENTS

| 5,306,646 A | 4/1994 | Lauf |
| 5,482,570 A | 1/1996 | Saurer et al. |
| 6,420,647 B1 * | 7/2002 | Ji et al. ........................ 136/259 |
| 2001/0033351 A1 * | 10/2001 | Takami et al. ............... 349/113 |
| 2002/0006471 A1 * | 1/2002 | Ohira et al. ................. 427/356 |

FOREIGN PATENT DOCUMENTS

| JP | 08-153882 | 11/1996 |
| JP | 9-248507 | * 9/1997 |
| JP | 10-161330 | 6/1998 |
| JP | 11-274536 A | 10/1999 |
| WO | WO 00/28603 | 5/2000 |

* cited by examiner

*Primary Examiner*—Timothy H Meeks
*Assistant Examiner*—Jimmy Lin
(74) *Attorney, Agent, or Firm*—Morrison & Foerster LLP

(57) ABSTRACT

A method of texturing a substrate or superstrate support material is provided, in which a thin textured film (32) is applied to the surface of the support material such as glass sheet (11). The dipping process is performed by loading a sheet (50) of the support material (11) into a frame (51) which provides a small number of small area contact points (52, 53) at which the sheet (50) is supported and lowering the frame (51) into texturing solution (59) comprising a mixture (59) of Sol-Gel (61) and texturing particles (62) comprising $SiO_2$ monospheres. The sheet is then withdrawn from the texturing solution and the resultant film allowed to dry. The film is then sintered and the resulting film provides a textured surface suitable for the formation of a photovoltaic device.

37 Claims, 7 Drawing Sheets

GLASS BEADS COATING PROCESS

INTRODUCTION

The following invention relates generally to the field of photovoltaic device fabrication and in particular, the invention provides an improved method of texturing glass sheets used as substrates in thin film solar cell fabrication.

BACKGROUND TO THE INVENTION

In the field of photovoltaic device manufacture, it has been long recognised that significant improvements in device efficiency are obtained if light can be internally reflected within the device such that its path length through the active region of the device is extended.

Techniques for extending the path length of light in the active region of the device are generally known as light trapping and usually involve texturing of the device surface.

In bulk material devices, the surface of the semiconductor material is directly textured by use of selective etching agents that etch certain crystal planes more rapidly than others, causing an angular or pyramidal surface profile.

It was generally thought that surface texturing would not be effective in thin film devices because traditional surface texturing is on a scale greater than film thickness of recent thin film devices, and because device film thicknesses are approaching the wavelength of light.

However, it has been found that surface texturing can be very effective in thin film devices provided that the scale of the texturing is less than the average film thickness but larger than the wavelength of light in the semiconductor material.

One effective method of achieving surface texturing on this scale is to texture the substrate before forming the semiconductor film in which the device is to be formed.

Texturing of the substrate can be by abrasion or etching but one effective method of texturing the substrate is by forming a textured film on the surface. The only effective methods previously identified for obtaining a uniform thin texture coating are spinning and chemical vapour deposition. These methods apply the textured film only to the surface of the substrate onto which the semiconductor layer will be deposited. It has always been considered that texturing the other surface of the substrate, which is to be exposed in use, would be detrimental to long term performance due to dust trapping and less effective cleaning when exposed to rain.

However, it has been found that with texturing of in the order of 1 μm or below, the problem of dirt accumulation is not sufficiently significant to present a performance problem.

Texturing the exposed surface also reduces specular reflection which enhances appearance, particularly if variations exist in glass flatness over the area of a panel (eg, up to 1 m$^2$), or between adjacent panels. Reduced reflection also reduces glare, which could be an aviation hazard when large installations or large numbers of small installations are located in an area under a flight path.

a Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

b Any description of prior art documents herein is not an admission that the documents form part of the common general knowledge of the relevant art in Australia.

c Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed in Australia before the priority date of each claim of this application.

SUMMARY OF THE INVENTION

According to a first aspect, the present invention consists in a method of manufacturing a thin film photovoltaic device on a transparent sheet of substrate material, the method comprising the steps of a) forming a textured film on two opposed surfaces of the substrate material by dipping the substrate in a container of film material in liquid form, removing the substrate material and hardening the liquid film material to form the textured film;

b) forming a thin film photovoltaic device on one of the textured films.

In one set of embodiments, a textured film is applied to the glass surface by mixing crushed quartz having particle dimensions in the order of 0.5-3 μm and preferably in the order of 1-2 μm into a glass sol, applying the mixture to the glass surface and heating to sinter the glass sol to form a dielectric layer. Note that the final feature dimension of the surface in this case includes quite small features, being determined largely by the surface roughness of the crushed quartz and the thickness of the dielectric layer, as well as the particle size of the quartz.

In preferred embodiments of the invention, the texturing of the substrate or superstrate is achieved by an SiO$_2$ layer which includes monospheric SiO$_2$ particles in the range of 0.1-2 μm in diameter. Preferably, the monospherical particles are in the range of 0.5-0.9 μm and in a particularly preferred embodiment, the particles are approximately 0.7 μm (eg, 0.65-0.75 μm). The particles are located in a smooth SiO$_2$ film having a thickness in the range of 0.2-0.8 times the diameter of the monospheric particles. Preferably, the SiO$_2$ layer is in the range of 0.35-0.5 times the particle diameter and in the particularly preferred embodiment, is approximately 0.3 μm (eg, 0.25-0.35 μm). The difference between particle dimension and film thickness results in a textured surface, however in this case the features can be more greatly spaced as they are larger. Both the SiO$_2$ particles and the film are made by a Sol-Gel process.

Note: all dimensions of monospheric SiO$_2$ particles and films throughout this specification are after sintering.

The SiO$_2$ layer also provides a barrier layer between the glass substrate and the silicon film. A separate barrier layer may also act as an anti-reflection layer and will be arranged to have a thickness equal to a quarter wavelength±20% which in the case of silicon nitride is 70 nm±20%.

The texturing process involves coating the surfaces to be textured with a sol-gel texturing solution in which the viscosity of the sol is quite low and is adjusted to allow the desired film thickness to be attained for the particular application. Film thickness is also determined to some extent by the speed at which the substrate material is pulled from the texturing solution.

The concentration of SiO$_2$ particles deposited on the substrate will vary according to the application, but generally, particles will be deposited in a single layer with each particle being separated by distances in the range of from 0 to 5 times the particle diameter and preferably in the range of 0 to 3 times the particle diameter. Particle separation is controlled by adjusting the concentration of particles in the texturing solution and to some extent by the speed of withdrawal from the solution and the humidity of the air.

The dipping of the substrate is preferably achieved by placing a of sheet of substrate material on a supporting frame such that the sheet is supported only at a few points (eg, 2 at the bottom and 2 at the top) lowering and retrieving the frame and supported sheet into a vessel of the texturing solution deep enough to allow the sheet of substrate material to be submerged. It will be appreciated that by using a larger vessel and by suitably adapting the supporting frame a plurality of sheets could be coated simultaneously if required.

The invention is applicable to both crystalline and amorphous silicon thin film solar cells. In the case of amorphous silicon cells, a transparent conducting layer is formed over the texturing film and a thin silicon film is formed over the transparent conducting layer, or alternatively the texturing film containing the texturing particles may itself be of conducting material.

In embodiments of the invention, the texturing layer preferably includes surface features having dimensions in a range from 0.5-0.2 times the thickness of the silicon film.

The silicon film is typically less than 5 µm thick and preferably has a thickness of 2 µm or less. The silicon film is typically at least 0.5 µm or greater and preferably greater than 1 µm. Typically, the scale of textured surface features is in the range of 0.01-10 µm. The useful lower limit of the feature size is in the order of a wavelength of light in crystalline silicon and typically the useful lower limit is 0.03 µm. The texturing may also include large scale features which have dimensions greater than the thickness of the silicon film, however these do not significantly alter the amount of light trapping achieved.

In typical embodiments of the invention the back surface of the silicon film structure (ie, remote from the glass) has a reflective material formed over it. Typically, the reflective material will be a metallisation structure used to contact the active regions of the cell. The metallisation structure will in some embodiments, be separated from most of the silicon back surface by an insulating layer.

BRIEF DESCRIPTIONS OF THE DRAWINGS

Embodiments of the invention will now be described by way of example, with reference to the accompanying drawings in which.

Figure 4:
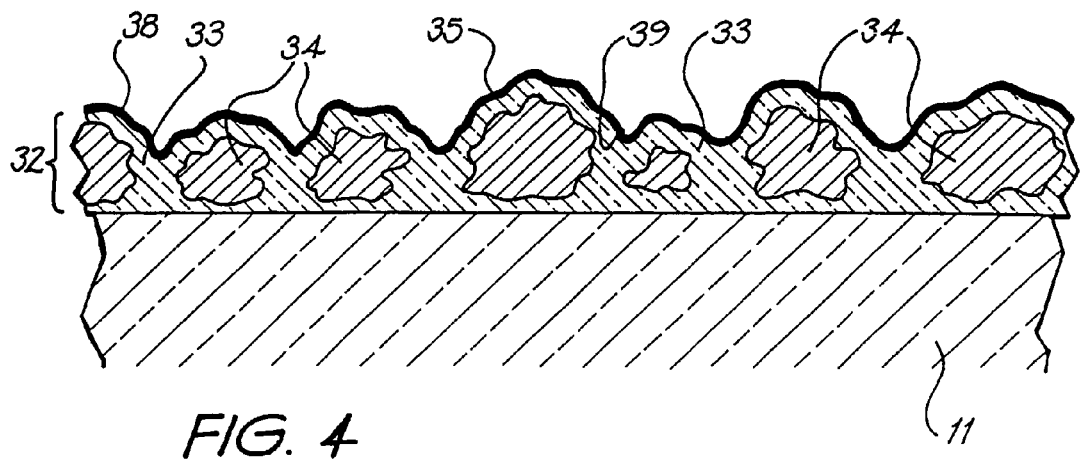
Figure 5:
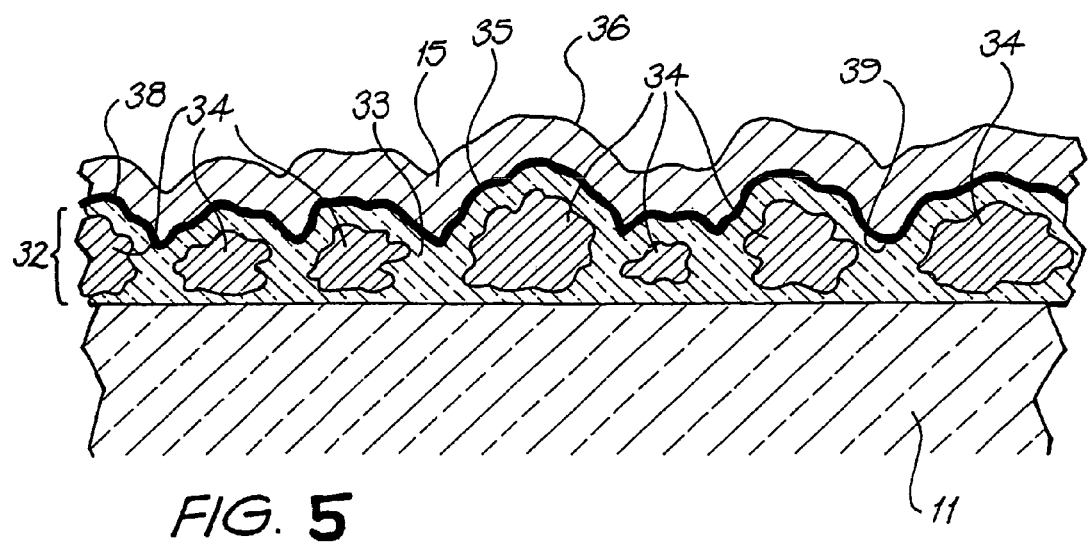
Figure 6:
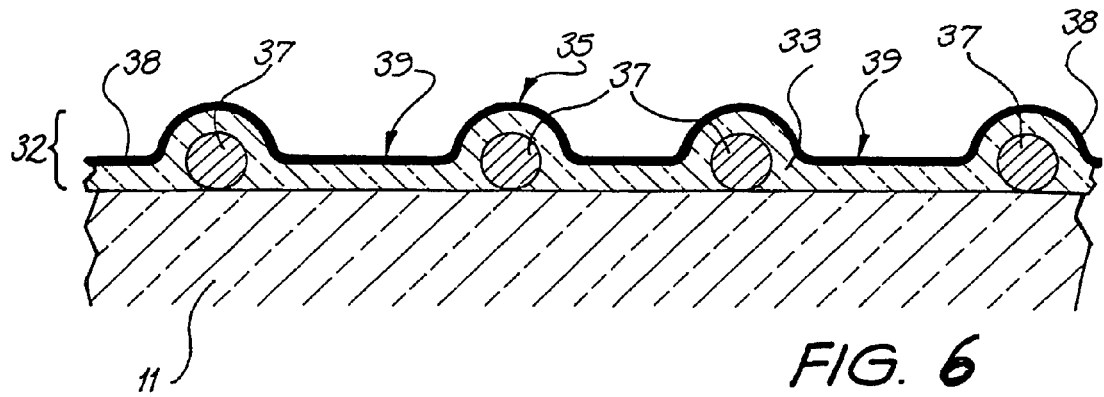
Figure 7:
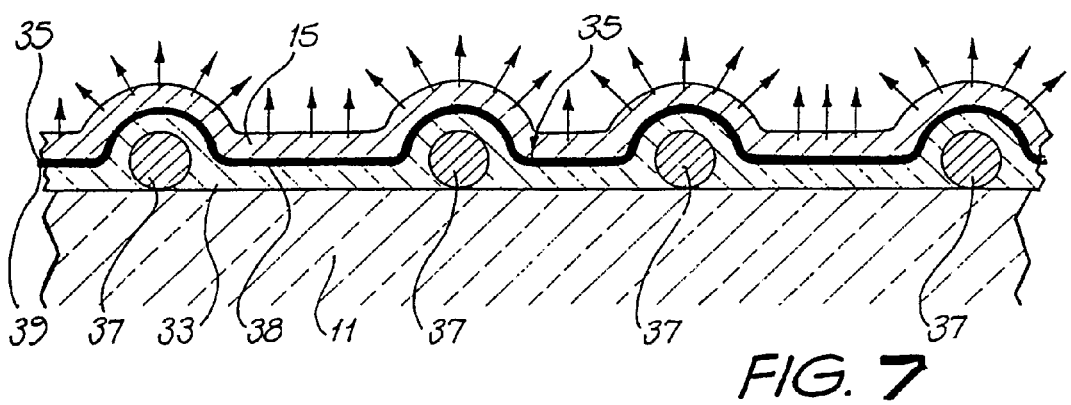
Figure 8:
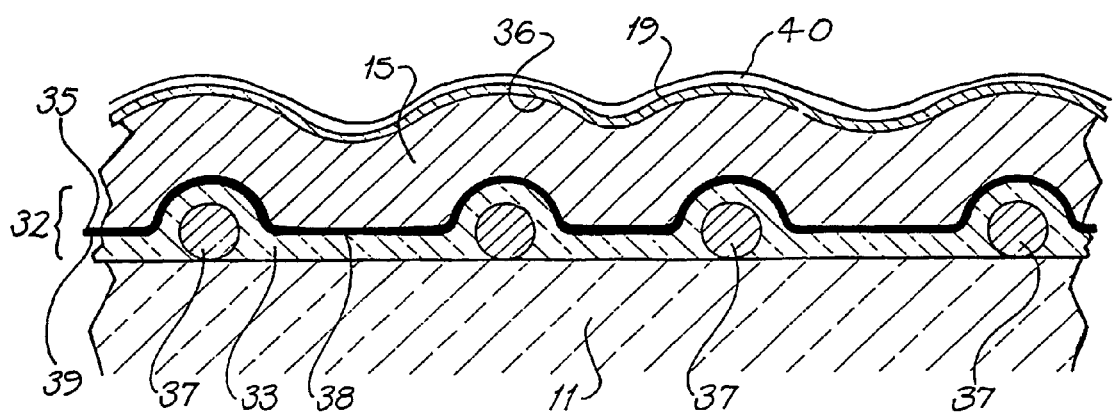
Figure 9:
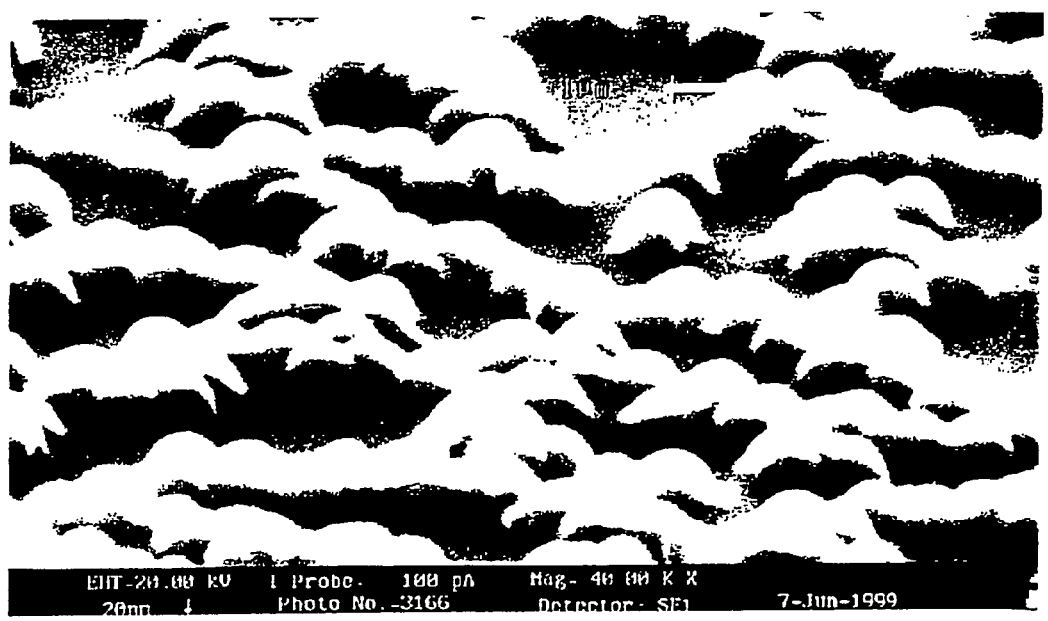
Figure 10:
Figure 11:
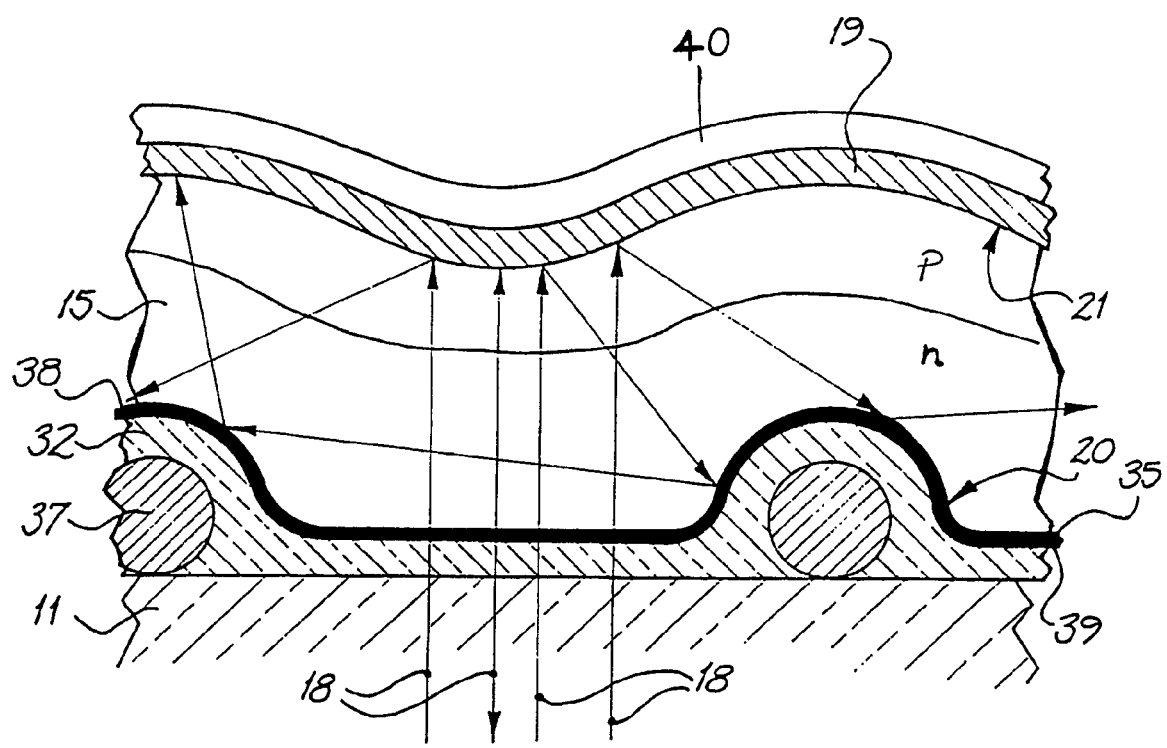

FIGS. 4 and 5 schematically illustrate two stages in the formation of a first embodiment of the invention in which a textured film is applied to the substrate;

FIGS. 6, 7 and 8 schematically illustrate three stages in the formation of a second embodiment of the invention in which a different textured film is applied to the substrate;

FIG. 9 is a photograph of a textured surface in accordance with the method described with reference to FIGS. 6, 7 and 8;

FIG. 10 is a photograph of a section through a device manufactured by the method described with reference to FIGS. 6, 7 and 8;

FIG. 11 is a sectional side view of a glass substrate with a textured dielectric ($SiO_2$) layer and a thin film of silicon formed over its surface, illustrating representative paths of incident photons through the glass substrate, the texturing layer and the silicon layer;

DETAILED DESCRIPTION OF EMBODIMENTS OF THE INVENTION

Figure 1:
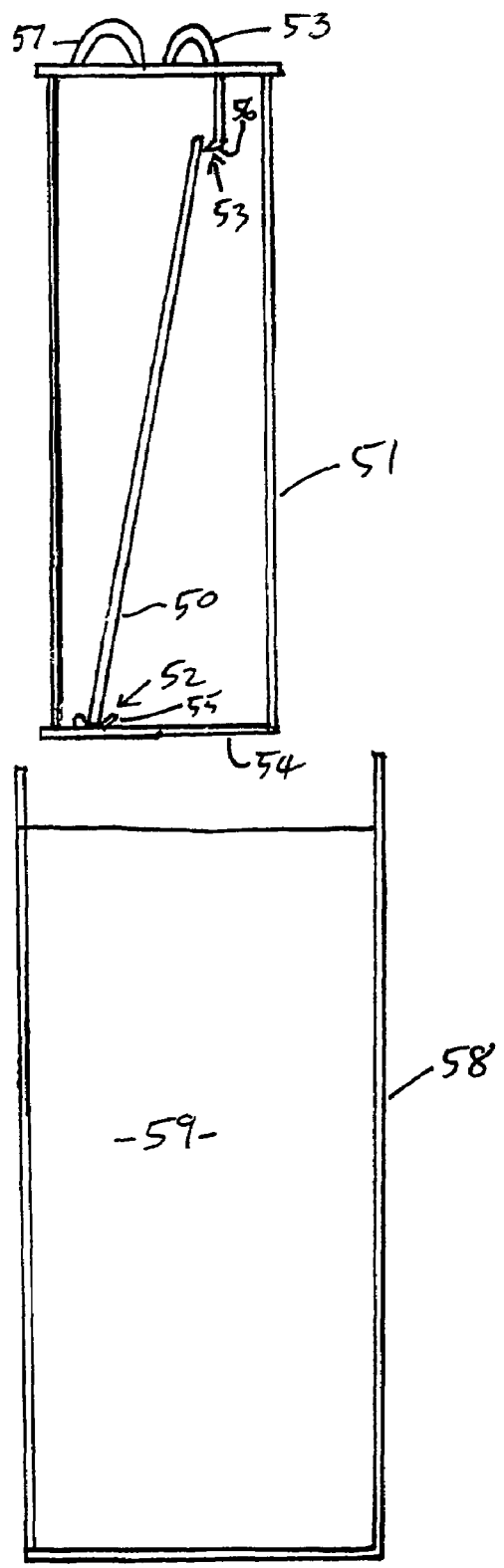
FIG. 1 is a side view of a frame carrying a sheet of substrate awaiting dipping in a vessel of texturing solution.
Figure 2:
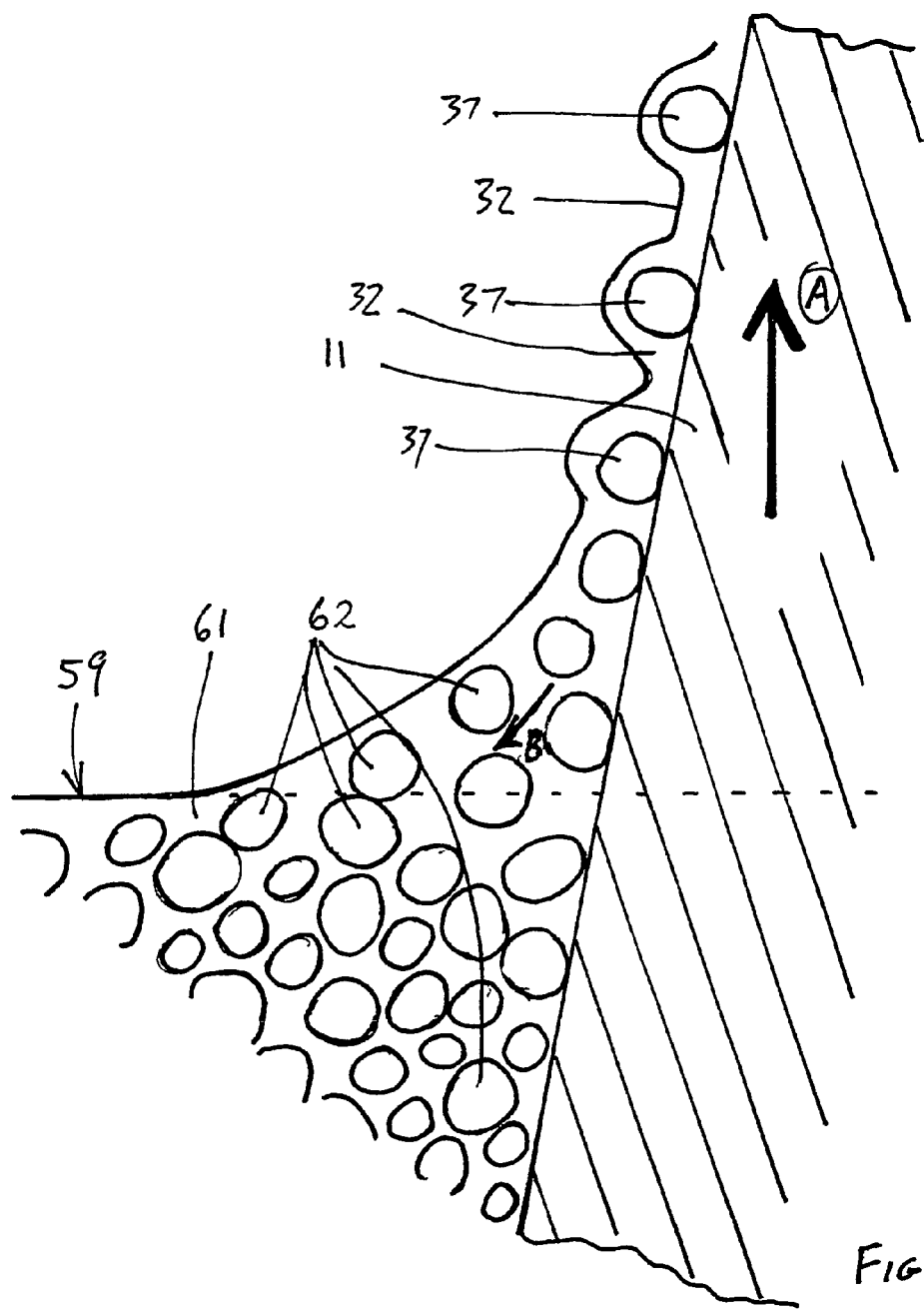
FIGS. 2 and 3 are detailed sectional views of a sheet of substrate at the surface of the wet texturing film during withdrawal of the substrate from the texturing solution in the dipping process.
Figure 3:
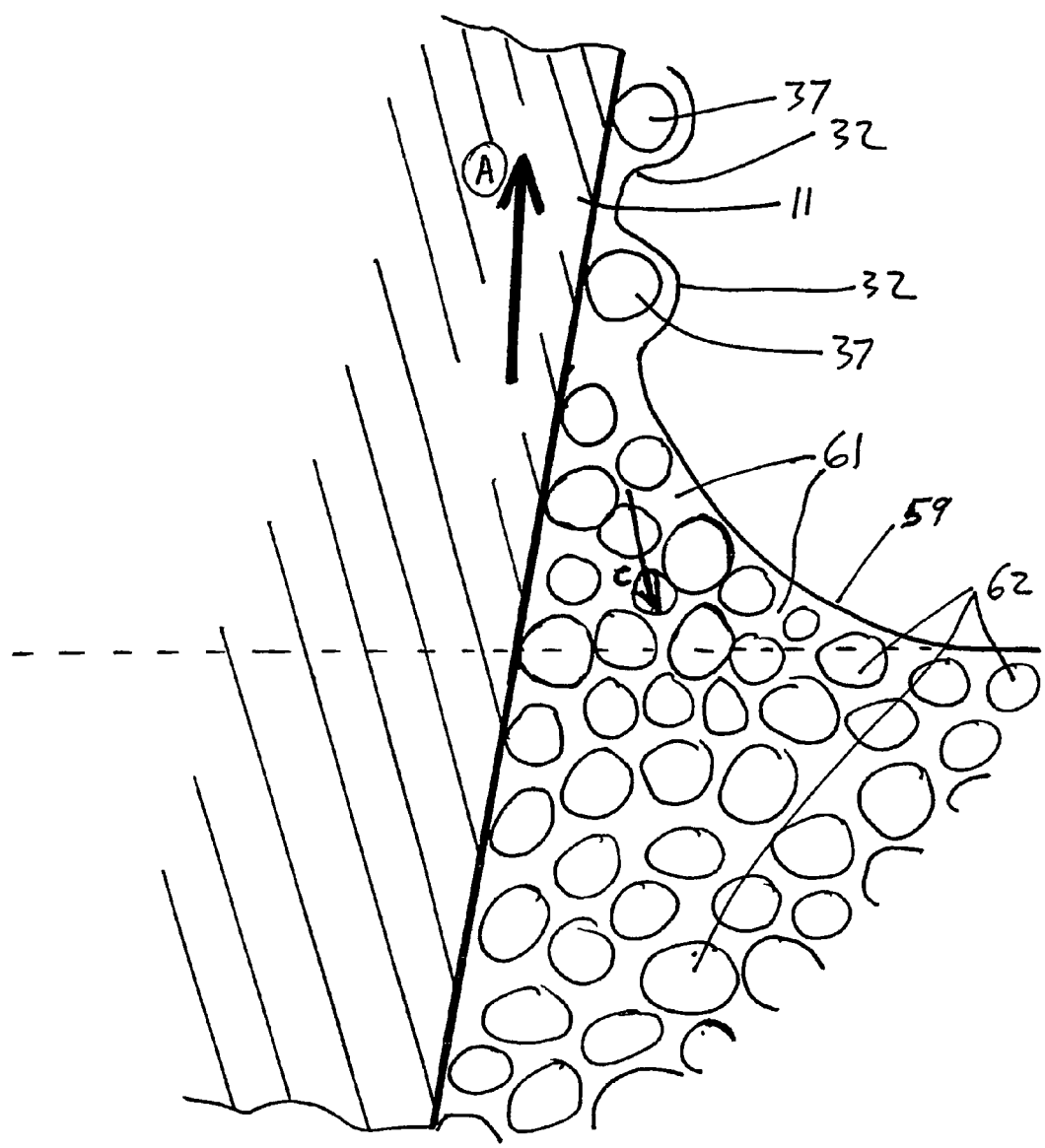

Referring to FIGS. 1, 2 & 3, embodiments of the present invention employ a dipping process to apply a thin textured film 32 to the surface of a glass substrate 11. The dipping process is performed by loading a sheet 50 of the substrate 11 into a frame 51 which provides a small number of small area contact points 52, 53 at which the sheet 50 is supported. The lower contact points 52 are provided on a pair of parallel, horizontal rods 54 which are provided with locating projections 55 to prevent lateral movement of the sheet of substrate 50, while the upper contact points 53 are tapered members against which the sheet 50 leans.

Suspension loops 57 are provided on an upper member of the frame 51, for the attachment of cables for lifting and lowering the frame. After it is loaded with a sheet 50, the frame 51 is lowered into a vessel 58 containing a texturing solution 59 comprising a mixture 59 of Sol-Gel 61 and texturing particles 62. The texturing particles are preferably $SiO_2$ monospheres.

The depth of the texturing solution 59 in the vessel 58 is sufficiently deep to enable the sheets 50 on the frame 51 to be entirely submerged in the texturing solution when the frame 51 is lowered into the vessel 58. Once the sheet of substrate material 50 is completely submerged and its surfaces wetted with texturing solution, the frame is lifted from the vessel at a controlled rate such that the texturing solution runs from the surfaces of the sheet 50 leaving only a thin film 32 embedded with texturing particles 37 on the surface of the substrate 11. Jets of Nitrogen gas located a few centimeters above the surface of the texturing solution in the vessel can be used to speed the drying process, which takes only a few seconds. A detailed sectional view of the interface between an upper surface of a sheet 50 of substitute material 11 and the surface of the texturing solution 59, during lifting of the frame 51, is illustrated in FIG. 2 in which the substrate 11 is moving in the direction of arrow A and the texturing solution 59 is draining in the direction of arrow B.

FIG. 3, similarly shows the interface at the undersurface of the sheet 50 of substrate material 11 when the substrate material is moving in direction A and the Sol-Gel mixture 59 is draining in direction C.

Once the textured Sol-Gel film 32 has been coated on the surfaces of the sheet 50, the film is sintered to harden the film. Typically the sheet is hardened by passing it through a belt furnace operating at a temperature of close to the maximum that can be tolerated by the sheet, which for glass substrate is 300° C.-600° C. for a period of in the order of two minutes. Alternatively, sintering may occur as the sheet is heated to the deposition temperature for a following step which in this case will be the deposition of the anti-reflection coating and silicon film.

Referring to FIGS. 4 and 6, as a result of the coating process described above, the glass substrate 11 is given a texturing layer 32 on each surface comprising an $SiO_2$ film 33 mixed with texturing particles 34 having diameters in the order of 1-2 µm whereby a textured surface 39 is formed. The $SiO_2$ film 33 is thinner than the average diameter of the texturing particles 34, 37 such that the texturing particles 34, 37 cause the surface of the SiO2 film to undulate over the particles. In the case of FIG. 4, the texturing particles 34 are particles of crushed quartz whereas in FIG. 6 the texturing particles 37 are silicon dioxide monospheres.

The dielectric layer in this case provides a barrier layer function, however, a separate anti-reflection coating 38 will normally be employed, having an upper surface 35 which is conformal with the textured surface 39. As illustrated in FIG. 5, a silicon film 15 is then formed over the textured surface 35 of the anti-reflection coating 38. The silicon film has a thickness preferably in the range of 0.5-2 µm (ie, of similar thickness to the dimensions of the texture features provided on the surface of the $SiO_2$ layer). Although the silicon film produced by this method loosely conforms to the textured surface over which it is formed, the opposite surfaces of the film are substantially non-parallel, at least on a small scale such that light will generally traverse the silicon film at an angle to the silicon surface.

More importantly, the light will more often than not strike the rear surface of the silicon film (upper surface, in FIGS. 4 and 5) at a significant angle to the normal to the surface 36, such that for a significant number of incidences, total internal reflection will occur. The surface 36 may also be coated with a reflective material 39 (such as a rear metal contact) to assist in reflecting internal light striking this surface.

Referring to FIGS. 6, 7 and 8, another embodiment is illustrated in which a layer 32 of $SiO_2$ 33 is applied to the surface of the substrate 11, the $SiO_2$ layer 32 including $SiO_2$ monospheres 37 which result in a textured surface of the layer 32.

The steps for forming the embodiment of FIGS. 6, 7 and 8, include forming an $SiO_2$ Sol by the Sol-Gel process, in which monosphere particles of $SiO_2$ are formed in the $SiO_2$ sol during its preparation and the $SiO_2$ sol is applied to a substrate or superstrate 11 such that the resulting $SiO_2$ layer 32 produces a textured surface 39 for thin film solar cell fabrication. An anti-reflective coating 38 having an upper surface 35 will normally also be applied. In the preferred embodiment, the $SiO_2$ layer 32 includes monospheric $SiO_2$ particles 37 of approximate 0.7 µm diameter and a smooth $SiO_2$ film 32 of approximate 0.3 µm thickness which covers the $SiO_2$ particles 37. The difference between particle dimension and film thickness results in a textured surface. However, particles in the range from 0.5-2 µm can be used with $SiO_2$ film thicknesses in the range 0.2-0.8 times the monosphere diameter.

Referring to FIG. 7, when a silicon film 15 is in the process of being deposited over the textured surface 35 of the barrier layer 38, using a formation method such as Chemical Vapour Deposition (CVD), the film will grow simultaneously from all points on the surface at a substantially constant rate in a direction normal to the surface at the respective points. This results in a film similar to that shown in FIG. 8, where small relatively sparse texturing features on the surface of the substrate (ie, on surface 35) result in larger features which merge into one another on the opposite surface 36 of the silicon film. This structure provides a significant non-parallelism between the surfaces of the silicon film and produces good light trapping when the film is illuminated through the substrate. Note also that this approach is useful for amorphous silicon devices, and crystalline silicon devices both when the crystalline structure is formed directly and when the crystalline structure is formed by crystallising amorphous silicon (eg; by solid phase crystallisation).

Finally, after the silicon has been formed and any processing required to be performed over the entire silicon layer has been completed, such as the formation of a dielectric layer 19, a metal layer 40 is applied over the silicon surface 36 to provide a back reflector and to be processed into contacts for contacting to the semiconductor device formed in the silicon film. The dielectric layer 19 is located between the silicon 15 and the metal layer 40 in order to isolate the metal from the upper region of the semiconductor film such that portions of the metal can be connected through to the lower region of the semiconductor film without shorting the junction.

Both the $SiO_2$ particles 37 and film 33 in which they are applied, are made by a Sol-Gel process. The Sol-Gel process involves mixing a metal organic compound with water acting as a hydrolysis agent and alcohol as the solvent. The metal organic compound reacts with water in the solution to form a metal oxide polymer. Sizes of the polymer particles depend on the pH value of the solution. The solution after reaction is called a Sol. The sol transits to a Gel when the solvent evaporates. Further sintering makes the Gel become a rigid metal oxide (ie, an $SiO_2$ dielectric layer).

The Sol-Gel process has certain advantages, such as high purity, well-controlled concentration and simple formation. These advantages determine that the process has wide applications. For example, the Sol-Gel process known as Spin-On Glass (SOG) has been used in the semiconductor industry for years. However, usually it would not be desirable to produce a gel which contained particles of any significant size, as in the present case.

Among metal oxides formed by the Sol-Gel process, $SiO_2$ sol has been applied in various industries. In the semiconductor industry, $SiO_2$ layers formed by this process have been used to form a dielectric layer and a planarisation layer. It can also be used to form a doping source if dopant is added into the $SiO_2$ sol. The $SiO_2$ film has also been used as an anti-reflection layer, barrier layer, strengthening layer, chemical resistant layer and so on.

As mentioned above, the size of the polymer particles 37 can be adjusted by the pH value of the solution. Generally speaking, as the pH value of the solution is decreased below 7, the particle size decreases to values which can become less than 100 nm. Most Spin-On Glasses behave in this manner. As the pH is increased to values greater than 7, the particle size increases to values which can be more than 1.0 µm.

This embodiment has significant advantages even over other desirable embodiments of the invention, as follows:

i) The $SiO_2$ particle can be made monosize and monoshape (spherical). Therefore, together with the $SiO_2$ film, the texture made can be very smooth and uniform in terms of height of the texture features. This feature is important for fabrication of high efficiency thin film solar cells because it reduces any sharp grooves/cracks, and thus reduces shunting problems without further processing of the texturing.

ii) Instead of creating flaws at the glass surface by chemical texturing or sand blasting, the Sol-Gel texture layer actually fills the flaws so that the glass may be strengthened after texturing;

iii) The Sol-Gel texture provides an extra barrier layer to impede the migration of impurities from glass to Si film;

iv) The texture can be subjected to very high temperature (eg, up to Si melting point), without causing damage to the texture features because the texture is made by $SiO_2$ which has a higher softening point than the glass substrate;

v) It is an environmentally friendly process. The only potentially problematic step is the possible release of ethanol to the atmosphere during processing, although it would be a relatively simple matter to recycle the ethanol. Chemical texturing, by comparison, will produce vast quantities of HF waste;

vi) The process of applying the texture layer is not difficult to scale up;

vii) The Sol-Gel process costs less than chemical texturing if the cost of waste treatment is included in the cost of chemical texturing;

viii) By coating both surfaces of the glass, the upper surface in use (the non-active surface) is significantly less specular, providing improved appearance and reduced glare. Surface irregularities and misalignments are less noticeable;

ix) Spectral response of solar cells is improved;

x) By coating both surfaces of the glass, thermal stress effects are reduced.

Illustrated in FIG. 11, is a sectional view of an embodiment similar to that of FIGS. 6 to 8, in which are shown photons of light which enter or exit the silicon film 15 along paths 18 through the substrate and are reflected within the silicon film 15, between the lower dielectric/silicon interface 20 (or anti-reflection layer/silicon interface) and the upper silicon/dielectric interface 21 or the surface of the metal (back contact) 19, several times, thereby increasing the conversion efficiency of a photovoltaic cell formed in the thin silicon film.

The present invention may also be applied to amorphous silicon cells in which case the conventional processing steps for manufacture of amorphous cells would be amended as follows:—

1) to the surface of a glass substrate or superstrate, apply a texturing layer comprising texturing particles bound in a transparent conducting oxide (TCO) matrix. The transparent conducting material can be applied by a dipped Sol-Gel process and the texturing particles may be $SiO_2$ beads, crushed quartz or particles of the TCO material itself;

2) form an amorphous silicon film over the TCO matrix, or alternatively:

1) to the surface of a glass substrate or superstrate, apply a texturing layer comprising texturing particles bound in an $SiO_2$ matrix, as described with reference to FIGS. 4 to 8 above;

2) form a TCO film over the $SiO_2$ matrix;

3) form an amorphous silicon film over the TCO film.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of manufacturing a thin film photovoltaic device on a transparent sheet of substrate or superstrate support material, the method comprising the steps of
   a) dipping the support material in a container of film material in liquid form comprising a mixture of texturing particles in a predetermined concentration in an $SiO_2$ sol-gel,
   b) removing the support material to deposit the texturing particles on exposed surfaces in a single layer, and wherein particle separation within the single layer is controlled by adjusting the concentration of particles in the sol-gel and speed of withdrawal of the support material from the solution;
   c) hardening the liquid film material to form a textured film on the support material, whereby the texturing film, after hardening, comprises the texturing particles bound in an $SiO_2$ matrix;
   d) forming a thin film of semiconductor material on the textured film; and
   e) forming a photovoltaic device into the thin film of semiconductor material.

2. The method of claim 1, wherein the textured film is an $SiO_2$ layer which includes monospheric $SiO_2$ particles located in a smooth $SiO_2$ film.

3. The method of claim 2, wherein the monospherical particles are in the range of 0.1-2 μm in diameter, after hardening.

4. The method of claim 2, wherein the monospherical particles are in the range of 0.5-9 μm in diameter, after hardening.

5. The method of claim 2, wherein the monospherical particles are in the range of 0.65-0.75 μm in diameter, after hardening.

6. The method of claim 5, wherein the smooth $SiO_2$ film has a thickness in the range of 0.2-0.8 times the diameter of the monospheric particles, after hardening.

7. The method of claim 6, wherein the $SiO_2$ film is in the range of 0.35-0.5 times the particle diameter, after hardening.

8. The method of claim 6, wherein the $SiO_2$ film is in the range of 0.25-0.35 μm, after hardening.

9. The method of claim 8, wherein the hardening step comprises sintering the textured film at a temperature in the range of 300° C.-600° C.

10. The method of claim 9, wherein a separate anti-reflection layer is located between the textured film and the semiconductor film to act as a barrier layer.

11. The method of claim 10, wherein the semiconductor film is silicon, the separate anti-reflection layer is silicon nitride, and the silicon nitride layer thickness is 70 nm±20%.

12. The method of claim 1, wherein the textured film is applied to the surface support material by mixing crushed quartz into a glass sol, applying the mixture to the surface substrate of the support material and heating to sinter the glass sol to form a dielectric layer.

13. The method of claim 12, wherein the crushed quartz has particle dimensions in the order of 0.5-3 μm.

14. The method of claim 12, wherein the crushed quartz has particle dimensions in the order of 1-2 μm.

15. The method of claim 1, wherein the sol-gel texturing solution has a low viscosity which is adjusted to allow the desired film thickness to be attained for the particular application.

16. The method of claim 15, wherein the film thickness of the $SiO_2$ layer is determined by the speed at which the substrate material is pulled from the texturing solution.

17. The method of claim 1, wherein the $SiO_2$ particles deposited on the substrate are deposited with each particle being separated from surrounding particles by distances in the range of from 0 to 5 times the particle diameter.

18. The method of claim 17, wherein each particle is separated from surrounding particles by distances in the range of 0 to 3 times the particle diameter.

19. The method of claim 18, wherein particle separation is controlled by the humidity of air in which the film is dried.

20. The method of claim 1, wherein the dipping of the support material is achieved by placing a sheet of support material on a support frame such that the sheet is supported at a plurality of points, lowering the frame and supported sheet into a vessel of the texturing solution deep enough to allow the sheet of support material to be submerged, and retrieving the sheet from the vessel.

21. The method of claim 20, wherein the sheet is supported at only 4 points.

22. The method of claim 1, wherein the thin film photovoltaic device is a crystalline silicon thin film solar cell.

23. The method as claimed of claim 1, wherein the thin film photovoltaic device is an amorphous silicon thin film solar cell.

24. The method of claim 23, wherein a transparent conducting layer is formed over the textured film and a thin silicon film is formed over the transparent conducting layer.

25. The method of claim 23, wherein the texturing film containing the texturing particles is a transparent conducting layer.

26. The method of claim 22, wherein the scale of textured surface features is in the range of 0.01-10 µm.

27. The method of claim 26, wherein the lower limit of the feature size is in the order of a wavelength of light in crystalline silicon.

28. The method of claim 26, wherein the lower limit of the feature size is in the order of 0.03 µm.

29. The method of claim 28, wherein the texturing includes large scale features which have dimensions greater than the thickness of the silicon film.

30. The method of claim 29, wherein the texturing layer includes surface features having a scale in a range from 0.5-0.2 times the thickness of the silicon film.

31. The method of claim 22, wherein the thickness of the silicon film is less than 5 µm.

32. The method of claim 31, wherein the thickness of the solution film is 2 µm or less.

33. The method of claim 32, wherein the thickness of the silicon film is at least 0.05 µm or greater.

34. The method of claim 33, wherein the thickness of the silicon film is greater than 1 µm.

35. The method of claim 22, wherein the surface of the silicon film remote from the support material has a reflective material formed over it.

36. The method of claim 35, wherein the reflective material is a metallisation structure used to contact active regions of the cell.

37. The method of claim 36, wherein the metallisation structure is separated from a majority of a back surface of the silicon by an insulating layer.

* * * * *